United States Patent
Ikezawa et al.

(10) Patent No.: US 6,810,736 B2
(45) Date of Patent: Nov. 2, 2004

(54) SEMICONDUCTOR DYNAMIC SENSOR HAVING CIRCUIT CHIP MOUNTED ON PACKAGE CASE WITH ADHESIVE FILM INTERPOSED

(75) Inventors: Toshiya Ikezawa, Kariya (JP); Takashige Saitou, Ama-gun (JP); Masaaki Tanaka, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/378,599

(22) Filed: Mar. 5, 2003

(65) Prior Publication Data

US 2003/0177831 A1 Sep. 25, 2003

(30) Foreign Application Priority Data

Mar. 20, 2002 (JP) ........................................ 2002-078731

(51) Int. Cl.⁷ ............................................ G01P 15/125
(52) U.S. Cl. ........................ 73/493; 73/514.32; 257/415
(58) Field of Search .................... 73/493, 488, 862.381, 73/514.32; 438/48, 50, 51, 52, 106, 107, 118, 125; 29/829, 831, 832; 156/60; 257/415

(56) References Cited

U.S. PATENT DOCUMENTS

| 5,483,106 A | * | 1/1996 | Echigo et al. ............... 257/783 |
| 6,448,624 B1 | | 9/2002 | Ishio |
| 2001/0055836 A1 | | 12/2001 | Kunda |

FOREIGN PATENT DOCUMENTS

JP   H-8-110351   4/1996

* cited by examiner

*Primary Examiner*—John E. Chapman
(74) *Attorney, Agent, or Firm*—Posz & Bethards, PLC

(57) ABSTRACT

A semiconductor dynamic sensor such as an acceleration sensor is composed of a sensor chip for detecting a dynamic force applied thereto and a circuit chip for processing output signals from the sensor chip. The sensor chip is supported on the circuit chip, and both chips are mounted on a package case. To suppress thermal stress transfer from the package case to the sensor chip through the circuit chip, an adhesive film having an elasticity modulus lower than 10 MPa is interposed between the circuit chip and the package case. Characteristics of the sensor chip are kept stable by suppressing the thermal stress transfer from the package case.

3 Claims, 4 Drawing Sheets

SEMICONDUCTOR DYNAMIC SENSOR HAVING CIRCUIT CHIP MOUNTED ON PACKAGE CASE WITH ADHESIVE FILM INTERPOSED

CROSS-REFERENCE TO RELATED APPLICATION

This application is based upon and claims benefit of priority of Japanese Patent Application No. 2002-78731 filed on Mar. 20, 2002, the content of which is incorporated herein by reference.

BACKGROUND OF THE INVENTION

1. Field of the Invention

The present invention relates to a semiconductor dynamic sensor such as an acceleration sensor for use in an automotive vehicle.

2. Description of Related Art

An example of a conventional acceleration sensor for use in an automobile is shown in FIG. 4. The acceleration sensor 110 includes a package case 101, a circuit chip 103 and a semiconductor sensor chip 105 supported on the circuit chip 103 via an adhesive film 104. The circuit chip 103 is mounted on the package case 101 with an adhesive 102 in which beads 109 made of resin are dispersed. The beads 109 have a high elasticity modulus of bout 5 giga-Pascal (5 GPa) to maintain a certain space between the circuit chip 103 and a mounting surface of the package case 101.

A beam structure including movable electrodes 156 that detect an amount of acceleration imposed thereon is formed on the semiconductor sensor chip 105. Signals representing the detected acceleration are processed in the circuit chip 103 and fed to an outside circuit. When heat is applied to the package case 101, for example, in a re-flow soldering process, the heat is transferred from the package case 101 to the circuit chip 103 and the semiconductor sensor chip 105. Since thermal expansion coefficients of those components are different from one another, a thermal stress is generated in the semiconductor sensor chip 105. The sensor characteristics change due to the thermal stress.

To suppress transmission of the thermal stress from the circuit chip 103 to the semiconductor sensor chip 105, the adhesive film 104 having a low elasticity modulus (about 1 MPa) is interposed therebetween. The thermal stress transferred to the circuit chip 103 from the package case 101 is not suppressed by the adhesive 102 because it contains the beads 109 having a high elasticity modulus. Although transmission of the thermal stress from the circuit chip 103 to the semiconductor sensor chip 105 is suppressed by the adhesive film 104, it cannot be completely interrupted. Because the semiconductor sensor chip 105 is highly sensitive to the thermal stress, its characteristics are affected by the transferred thermal stress even if its amount is small.

SUMMARY OF THE INVENTION

The present invention has been made in view of the above-mentioned problem, and an object of the present invention is to provide an improved semiconductor dynamic sensor having stable characteristics, avoiding thermal stress transfer to a semiconductor sensor chip.

A semiconductor dynamic sensor such as an acceleration sensor is composed of a semiconductor sensor chip, a circuit chip for processing outputs from the sensor chip and a package case for containing the sensor and circuit chips therein. The circuit chip is mounted on a mounting surface of the package case, and the sensor chip is supported on the circuit chip. In order to prevent a thermal stress from being transferred from the package case to the sensor chip through the circuit chip, an adhesive film having an elasticity modulus lower than 10 MPa is interposed between the package case and the circuit chip.

Preferably, another adhesive film having a low elasticity modulus is interposed between the sensor chip and the circuit chip. The adhesive film interposed between the package case and the circuit chip may be made of silicone or the like.

In this manner, thermal stress transfer from the package case to the semiconductor sensor chip through the circuit chip is suppressed, and thereby characteristics of the semiconductor sensor chip are kept stable.

Other objects and features of the present invention will become more readily apparent from a better understanding of the preferred embodiment described below with reference to the following drawings.

DETAILED DESCRIPTION OF THE PREFERRED EMBODIMENT

Figure 1:
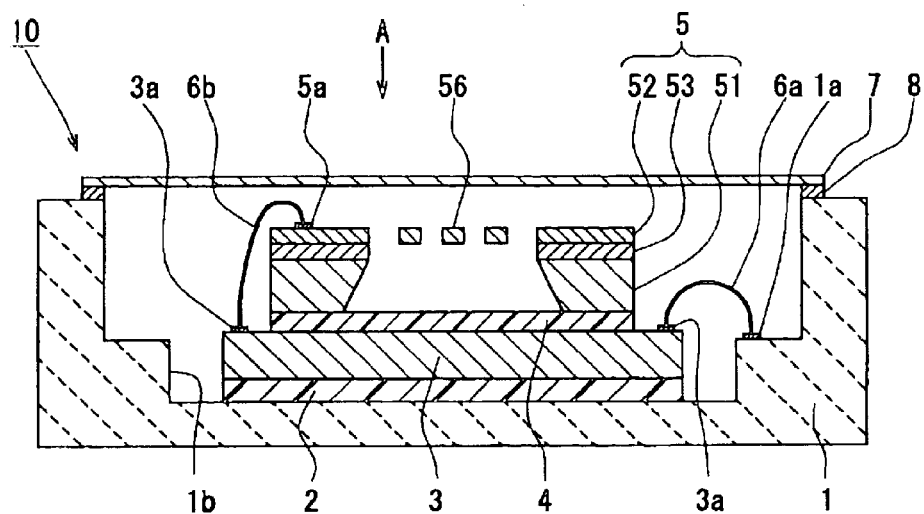
FIG. 1 is a cross-sectional view showing an acceleration sensor according to the present invention.

A preferred embodiment of the present invention will be described with reference to FIGS. 1, 2 and 3A–3H. As shown in FIG. 1, an acceleration sensor 10 is composed of a semiconductor sensor chip 5, a circuit chip 3, a package case 1 and a case cover 7. The package case 1 is made of ceramics and has a cavity 1b for containing therein components of the acceleration sensor. The circuit chip 3 is mounted on a amounting surface of the cavity 1b with a first adhesive film 2 interposed therebetween. The semiconductor sensor chip 5 is supported on the circuit chip 3 with a second adhesive film 4 interposed. Both of the adhesive films 2, 4 are made of a material such as silicone-type resin having an elasticity modulus, preferably, lower than 10 mega-Pascal (10 MPa).

Pads $1a$, $3a$ and $5a$ made of a material such as aluminum are formed on the package case 1, the circuit chap 3 and the semiconductor sensor chip 5, respectively. The semiconductor sensor chip 5 is electrically connected to the circuit chip 3 through bonding wires $6b$ connected between the pads $3a$ and $5a$. The circuit chip 3 is electrically connected to the package case 1 through boding wires $6a$ connected between the pads $3a$ and $1a$. The semiconductor sensor chip 5 is formed from a silicon-on-insulator (SOI) substrate composed of a first silicon substrate 51, an oxide film 53 and a second silicon substrate 52. The semiconductor sensor chip 5 includes a beam structure 56 having movable electrodes and stationary electrodes. An electrostatic capacitance of the beam structure 56 varies in accordance with an amount of acceleration imposed thereon. The amount of acceleration is detected based on changes in the electrostatic capacitance of the beam structure 56.

Figure 2:
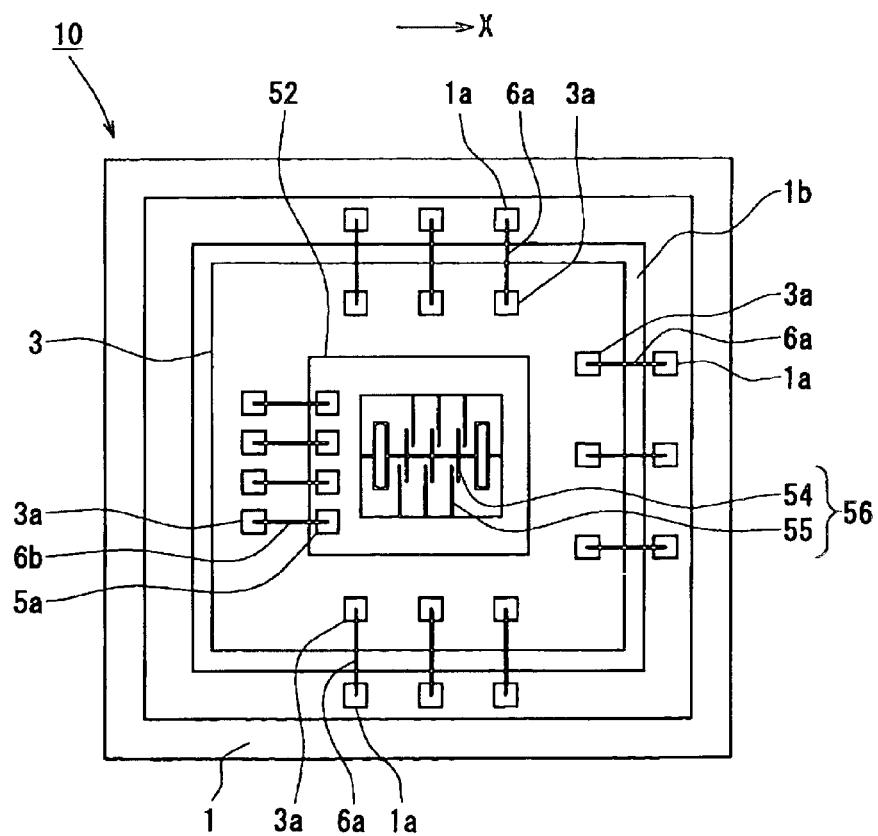
FIG. 2 is a plan view showing the acceleration sensor, viewed from direction A shown in FIG. 1 with a case cover removed.

Referring to FIG. 2, the structure of the semiconductor sensor chip 5 will be briefly described because this type of sensor chip has been well known. The beam structure 56 is formed by disposing the movable electrodes 54 and the stationary electrodes 55 in a comb-like shape. When an acceleration is imposed on the beam structure 56 in X-direction (shown in FIG. 2), the movable electrodes 54 displace in this direction. According to an amount of the displacement, an electrostatic capacitance between the movable electrodes 54 and the stationary electrodes 55 changes. Signals representing the capacitance changes are fed to the circuit chip 3 through the bonding wires 6b, and the circuit chip 3 outputs electrical signals such as voltage signals representing the detected amount of acceleration.

The electrical outputs from the circuit chip 3 are led to the package case 1 through the bonding wires 6a and outputted to an outside circuit through wirings (not shown) formed on the package case 1. As shown in FIG. 1, the case cover 7 made of an iron plate or the like closes an opening of the package case 1, thereby protecting the sensor components contained in the package case 1. The case cover 7 is connected to the package case 1 by welding a metallic member 7 formed on the package case 1.

Figure 3A:
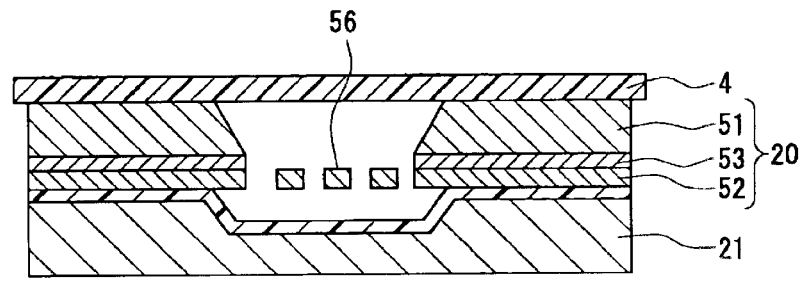
FIGS. 3A–3H are cross-sectional views sequentially showing a process of manufacturing the acceleration sensor.

Now, referring to FIGS. 3A–3H, a process of manufacturing the acceleration sensor 10 will be described. Each drawing shows a cross-sectional view, and the bonding pads 1a, 3a and 5a are not shown in the drawings. Plural semiconductor sensor chips 5 are formed on an SOI semiconductor wafer 20, using known semiconductor manufacturing processes, and then the wafer 20 is diced into individual sensor chips 5. FIG. 3A shows the semiconductor wafer 20 on which the sensor chip 5 is formed. The semiconductor wafer 20 is composed of a first silicon substrate 51, a second silicon substrate 52 and an oxide film 53 formed between both silicon substrates. The second adhesive film 4 is pasted on a surface of the first silicon substrate 51, and the protecting cover 21 is pasted on a surface of the second silicon substrate 52. The protecting cover 21 protects the surface of the second silicon substrate 52 from any damages in a following dicing process. A depressed portion is formed on the protecting cover 21 so that the protecting cover 21 does not contact the beam structure 56.

Figure 3B:
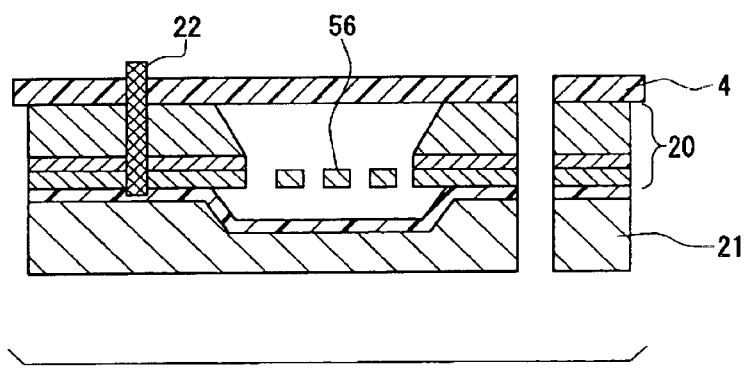
Figure 3C:
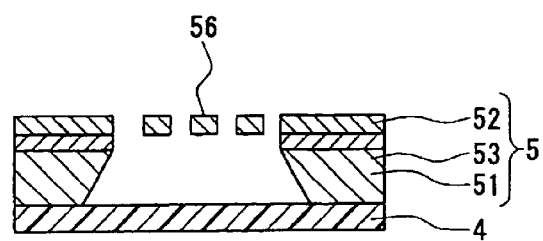
Figure 3D:

Then, as shown in FIG. 3B, the semiconductor wafer 20 on which plural sensor chips are formed is separated into individual pieces of sensor chips by dicing blade 22. The second adhesive film 4 and the protecting cover 21 are cut together with the semiconductor wafer 20. Then, as shown in FIG. 3C, the protecting cover 21 is peeled off, thereby completing the process of making the sensor chip 5 with the second adhesive film 4 pasted thereto.

Figure 3E:
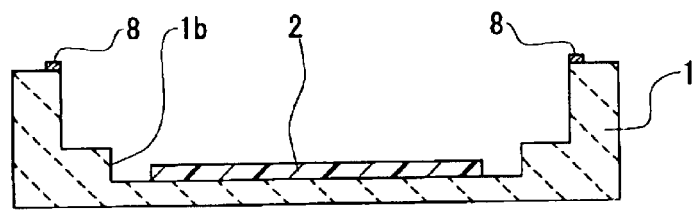
Figure 3F:
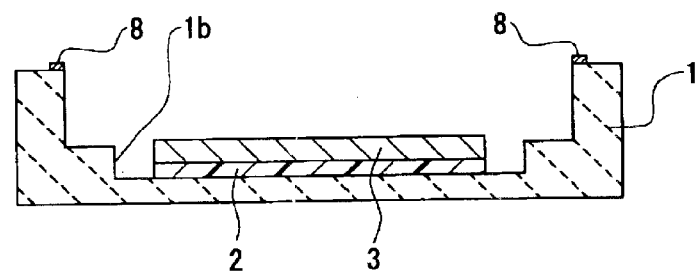

The circuit chip 3 (shown in FIG. 3D) is made separately from the sensor chip 5 in known manufacturing processes. As shown in FIG. 3E, the first adhesive film 2 is pasted to the mounting surface of the package case 1. Then, as shown in FIG. 3F, the circuit chip 3 is mounted on the package case 1 with the first adhesive film 2 interposed therebetween. Then, the circuit chip 3 is firmly connected to the package case 1 via the first adhesive film 2 by pressing and heating with a mounting jig. For example, the first adhesive film 2 is heated at about 180° C. for 2 seconds, while applying a pressing load of about 200 grams.

Figure 3G:
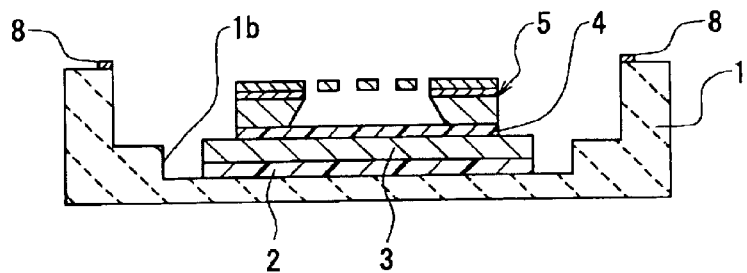
Figure 3H:
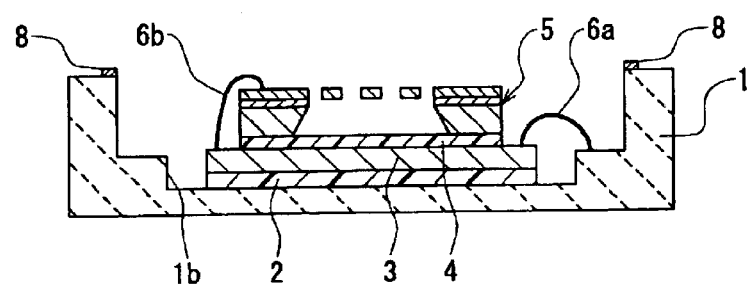
Figure 4:
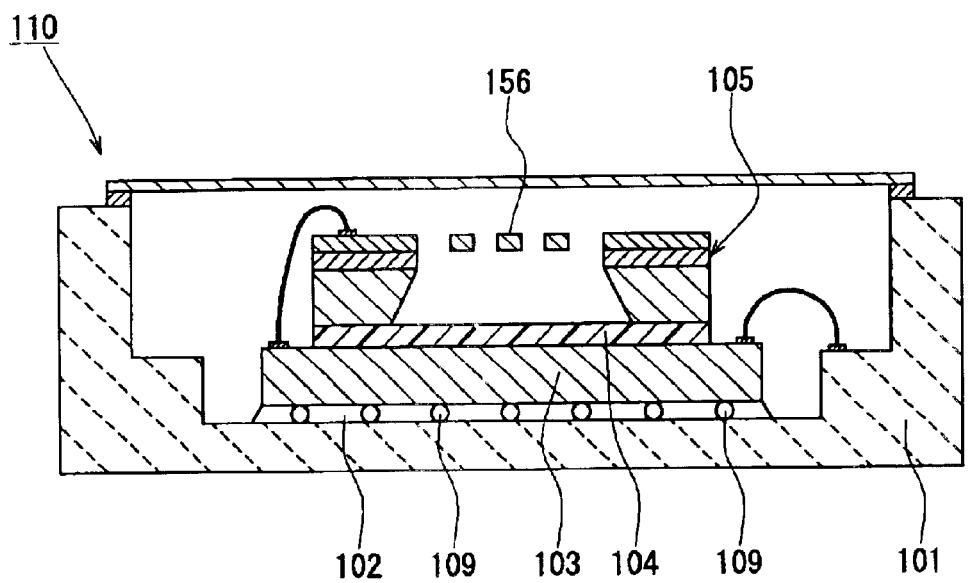
FIG. 4 is a cross-sectional view showing an example of a conventional acceleration sensor.

Then, as shown in FIG. 3G, the sensor chip 5 is mounted on the circuit chip 3 with the second adhesive film 4 interposed therebetween. The sensor chip 5 is firmly connected to the circuit chip 3 via the second adhesive film 4 by pressing and heating with a mounting jig. For example, the second adhesive film 4 is heated at about 250° C. for 2 seconds, while applying a pressing load of about 200 grams. Then, the package case 1 on which the sensor chip 5 and the circuit chip 3 are mounted is heated in an oven at about 150° C. for about 30 minutes, thereby curing the first and the second adhesive films 2, 4. Then, as shown in FIG. 3H, the sensor chip 5, the circuit chip 3 and the package case 1 are electrically connected by bonding wires 6a, 6b. Finally, the package case 1 is covered with the case cover 7 by welding the metallic member 8 on the opening edge of the package case 1. Thus, the acceleration sensor 10 is completed.

If the circuit chip 3 is connected to the package case 1 with an adhesive into which beads having a high elasticity modulus are dispersed as in the conventional acceleration sensor, a thermal stress is transferred to the sensor chip 5 when the package case 1 is heated in a process such as reflow-soldering. In the acceleration sensor 10 according to the present invention, the circuit chip 3 is connected to the package case 1 with the first adhesive film 2 having a low elasticity modulus (lower than 10 MPa). Therefore, the thermal stress transfer from the package case 1 to the circuit chip 3 is suppressed by the first adhesive film 2. Further, the thermal stress transfer from the circuit chip 3 to the sensor chip 5 is alleviated by the second adhesive film 4. Accordingly, the semiconductor sensor chip 5 is sufficiently protected from the thermal stress transferred from the package case 1. In this manner, the characteristics of the sensor chip 5 can be stably maintained even though the sensor chip 5 is sensitive to the thermal stress. In addition, since the first adhesive film 2 is formed in a sheet having a sufficient rigidity, it is possible to keep a required space between the mounting surface of the package case 1 and the circuit chip 3 without using the resin beads or the like.

The present invention is not limited to the embodiment described above, but it may be variously modified. For example, the present invention is applicable not only to the acceleration sensor but also to other dynamic sensors such as an angular velocity sensor. The beam structure 56 including the movable electrodes 54 used in the sensor chip 5 may be replaced with a piezoelectric element that generates electrical signals in response to a dynamic force applied thereto. Though the circuit chip 3 is mounted on the first adhesive film 2 after the first adhesive film 2 is pasted on the package case 1, it is possible to paste the first adhesive film 2 on the circuit chip 3 and then to mount the circuit chip 3 on the package case 1.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor dynamic sensor comprising:

a semiconductor sensor chip for detecting a dynamic force applied thereto;

a circuit chip for processing signals outputted from the semiconductor sensor chip, the semiconductor sensor chip being supported on the circuit chip; and a package case for containing therein the semiconductor sensor chip and the circuit chip, the circuit chip being mounted on the package case with an adhesive film interposed therebetween, wherein the adhesive film has an elasticity modulus lower than 10 MPa.

2. The semiconductor dynamic sensor as in claim 1, wherein:

the adhesive film is a silicone-type adhesive film.

3. The semiconductor dynamic sensor as in claim 1 wherein:

the semiconductor sensor chip is supported on the circuit chip with another adhesive film interposed therebetween.

* * * * *